(12) United States Patent
Bartley et al.

(10) Patent No.: US 8,736,068 B2
(45) Date of Patent: May 27, 2014

(54) HYBRID BONDING TECHNIQUES FOR MULTI-LAYER SEMICONDUCTOR STACKS

(75) Inventors: Gerald K. Bartley, Rochester, MN (US); Russell Dean Hoover, Rochester, MN (US); Charles Luther Johnson, Rochester, MN (US); Steven Paul VanderWiel, Rosemount, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/422,606

(22) Filed: Mar. 16, 2012

(65) Prior Publication Data

US 2012/0187570 A1 Jul. 26, 2012

Related U.S. Application Data

(62) Division of application No. 12/911,879, filed on Oct. 26, 2010, now Pat. No. 8,293,578.

(51) Int. Cl.
*H01L 21/00* (2006.01)
*H01L 25/065* (2006.01)
*H01L 25/00* (2006.01)
*H01L 25/18* (2006.01)

(52) U.S. Cl.
CPC ............ *H01L 25/0657* (2013.01); *H01L 25/50* (2013.01); *H01L 25/18* (2013.01)
USPC .................... 257/774; 257/777; 257/E23.011

(58) Field of Classification Search
CPC ..... H01L 25/0657; H01L 25/80; H01L 25/18; H01L 2225/06513
USPC .................................................. 257/774, 777
See application file for complete search history.

(56) References Cited

U.S. PATENT DOCUMENTS

| | | | |
|---|---|---|---|
| 7,649,386 B2 | 1/2010 | Ozguz et al. |
| 7,701,252 B1 | 4/2010 | Chow et al. |
| 7,930,661 B1 | 4/2011 | Trimberger et al. |
| 7,973,555 B1 | 7/2011 | Trimberger et al. |
| 8,089,299 B1 | 1/2012 | Rahman et al. |
| 2008/0150579 A1 | 6/2008 | Madurawe |
| 2008/0224322 A1 | 9/2008 | Shinogi |
| 2008/0230923 A1 | 9/2008 | Jo et al. |
| 2010/0047963 A1 | 2/2010 | Wang et al. |
| 2010/0062565 A1 | 3/2010 | Martin et al. |
| 2011/0193212 A1 | 8/2011 | Gu et al. |

OTHER PUBLICATIONS

U.S. Patent and Trademark Office, Office Action issued in related U.S. Appl. No. 12/431,259, dated Apr. 17, 2012.
U.S. Patent and Trademark Office, Office Action issued in related U.S. Appl. No. 12/855,854, dated Apr. 16, 2012.

(Continued)

*Primary Examiner* — Alexander Ghyka
(74) *Attorney, Agent, or Firm* — Wood, Herron & Evans, LLP

(57) ABSTRACT

A circuit arrangement and method utilize hybrid bonding techniques that combine wafer-wafer bonding processes with chip-chip and/or chip-wafer bonding processes to form a multi-layer semiconductor stack, e.g., by bonding together one or more sub-assemblies formed by wafer-wafer bonding together with other sub-assemblies and/or chips using chip-chip and/or chip-wafer bonding processes. By doing so, the advantages of wafer-wafer bonding techniques, such as higher interconnect densities, may be leveraged with the advantages of chip-chip and chip-wafer bonding techniques, such as mixing and matching chips with different sizes, aspect ratios, and functions.

11 Claims, 12 Drawing Sheets

(56) References Cited

OTHER PUBLICATIONS

U.S. Patent and Trademark Office, Office Action issued in related U.S. Appl. No. 12/911,879, dated Mar. 15, 2012.

U.S. Patent and Trademark Office, Office Action issued in related U.S. Appl. No. 13/422,566 dated Feb. 6, 2013.

U.S. Patent and Trademark Office, Notice of Allowance issued in related U.S. Appl. No. 12/855,854, dated Jan. 14, 2013.

U.S. Patent and Trademark Office, Notice of Allowance issued in related U.S. Appl. No. 12/911,879, dated Jun. 19, 2012.

U.S. Patent and Trademark Office, Notice of Allowance issued in related U.S. Appl. No. 12/431,259, dated Aug. 3, 2012.

U.S. Patent and Trademark Office, Office Action issued in related U.S. Appl. No. 13/618,656, dated Feb. 15, 2013.

HYBRID BONDING TECHNIQUES FOR MULTI-LAYER SEMICONDUCTOR STACKS

CROSS-REFERENCE TO RELATED APPLICATIONS

This application is a divisional of U.S. patent application Ser. No. 12/911,879, filed on Oct. 26, 2010 by Gerald K. Bartley et al., the entire disclosure of which is incorporated by reference herein.

FIELD OF THE INVENTION

The invention is generally related to interconnecting multiple semiconductor dies in a stack and the design of circuit logic therefor.

BACKGROUND OF THE INVENTION

As semiconductor technology continues to inch closer to practical limitations in terms of feature size, architects are increasingly focusing on alternative manners of meeting the demands for integrating increasingly complex circuitry onto semiconductor devices, or chips. In addition, as feature sizes decrease, and thus as faster and more complex circuits are integrated onto a given semiconductor chip, architects are finding that in many instances the communication of data between the various functional units on a semiconductor chip can become a bottleneck on overall performance. Communicating data between functional units disposed at opposite ends of a large semiconductor chip (e.g., a 300 or 500 mm2 die size) often requires several clock cycles, as well as significant buffering logic on the chip. Furthermore, in general as the size and amount of circuitry integrated into a chip design increases, the yield of the manufacturing process typically decreases, thereby increasing the cost of the manufactured chips.

One proposed solution to address these limitations has been to physically and electrically couple together multiple semiconductor chips or dies into a stack arrangement. By doing so, individual chips that are smaller, less complex, and less expensive can be used in lieu of a single larger, more complex and more expensive chip, and often with comparable or better overall performance. In many instances, for example, it has been found that the vertical distance between circuit logic disposed in different layers of a multi-layer semiconductor stack may end up being shorter than the maximum horizontal distances within any given circuit layer, and as such, communicating data between circuit layers disposed on different chips may involve less latency than communicating data between distant points on the same chip. Some conventional stacking technologies, for example, are capable of separating circuit layers on adjacent dies in a stack by less than 100 um, which is an order of magnitude or more less than the maximum horizontal dimension of many dies (e.g., a 100 mm2 die has a length and width of 10,000 um).

From a design standpoint, however, integrating circuits on multiple chips in a multi-layer semiconductor stack can be problematic. Laying out signal paths and electrical conductors to effectively interconnect circuits conventionally has required substantial design work, and opportunities for design reuse have been limited.

Another challenge for multi-layer semiconductor stacks is associated with the tradeoffs required when using different types of fabrication technologies. Traditionally, multi-layer semiconductor stacks have been formed using either chip-chip bonding or wafer-wafer bonding. Chip-chip bonding involves separating the semiconductor chips from their respective wafers prior to bonding the chips together in a stack, while wafer-wafer bonding involves bonding the chips in a stack together while they are still in wafer form, so that the separation from the wafer occurs after bonding has been performed.

Chip-chip bonding has the benefit that the chips are not constrained by size or aspect ratio, so practically any combination of chips, within reasonable limits, can be bonded together. Chip-chip bonding also can be used to bond practically any number of chips together in a stack. Furthermore, chips can be tested prior to bonding, thus enabling defective chips to be sorted out and discarded, thereby providing a higher yield for the overall stack arrangements. A primary drawback of chip-chip bonding, however, is that the interconnect density is typically limited by the need to align chips during the bonding process.

In contrast, wafer-wafer bonding allows for a substantially higher interconnect density than chip-chip bonding, but it suffers from a number of drawbacks. First, all chips in a wafer-wafer bonding process much be of identical size and aspect ratio. Second, wafer-wafer bonding is inherently a two chip stack process, so it cannot be used to bond together three or more chips in a stack. Third, wafer-wafer bonding is subject to the exponential problem with respect to yields, so it is often necessary to limit its use to situations where one of the wafers includes circuit logic that has a near 100% yield (e.g., memory arrays). Otherwise, the yields of the two wafers must effectively be multiplied, resulting in a substantially lower yield than the normal yield of a single semiconductor chip.

Therefore, a significant need exists in the art for an improved process for bonding together chips in a multi-layer semiconductor stack.

SUMMARY OF THE INVENTION

The invention addresses these and other problems associated with the prior art by providing a circuit arrangement and method that utilize hybrid bonding techniques that combine wafer-wafer bonding processes with chip-chip and/or chip-wafer bonding processes to form a multi-layer semiconductor stack, e.g., by bonding together one or more sub-assemblies formed by wafer-wafer bonding together with other sub-assemblies and/or chips using chip-chip and/or chip-wafer bonding processes. By doing so, the advantages of wafer-wafer bonding techniques, such as higher interconnect densities, may be leveraged with the advantages of chip-chip and chip-wafer bonding techniques, such as mixing and matching chips with different sizes, aspect ratios, and functions.

Therefore, consistent with one aspect of the invention, a multi-layer circuit arrangement may be manufactured by physically and electrically coupling first and second semiconductor dies with one another using a wafer-wafer bonding process to form a first electrical/physical interconnect between the first and second semiconductor dies, and physically and electrically coupling a third semiconductor die with the second semiconductor to form a second electrical/physical interconnect between the second and third semiconductor dies. Each semiconductor die includes opposing faces, where at least one face of each semiconductor die includes circuit logic integrated thereon and defining a circuit layer. In addition, each semiconductor die includes an array of conductive through vias extending through such semiconductor die. Furthermore, physically and electrically coupling the first, second and third semiconductor dies together forms a multi-layer semiconductor stack.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Embodiments consistent with the invention utilize hybrid bonding techniques combining wafer-wafer bonding processes with chip-chip and/or chip-wafer bonding processes to form a multi-layer semiconductor stack. For example, wafer-wafer bonding processes may be used to form wafer-wafer bonded sub-assemblies with two semiconductor dies, and those sub-assemblies may be bonded to one another, optionally along with one or more individual semiconductor dies, using chip-chip and/or chip-wafer bonding processes. As such, the advantages of wafer-wafer bonding techniques, such as higher interconnect densities, may be leveraged with the advantages of chip-chip and chip-wafer bonding techniques, such as mixing and matching chips with different sizes, aspect ratios, and functions.

Prior to discussing the aforementioned hybrid bonding techniques, however, an overview of one implementation of a multi-layer semiconductor stack and the design thereof, suitable for use in connection with such techniques, is provided.

Multi-Layer Semiconductor Stack with Inter-Layer Bus

Embodiments of the invention may be utilized in connection with a universal, standardized inter-layer bus, which, as disclosed in the aforementioned cross-referenced patent application, facilitates communication between functional units disposed in different circuit layers of a multi-layer semiconductor stack. In this regard, an individual circuit layer may be considered to include a two dimensional layout of logic circuitry disposed on a semiconductor substrate. It will be appreciated that, a single circuit layer may include multiple physical layers (e.g., metal layers, dielectric layers, etc.) as a result of fabrication processes, but that these multiple layers collectively define a logic circuit that is essentially laid out across a two dimensional footprint. A multi-layer semiconductor stack therefore includes multiple circuit layers interconnected with one another in an overlapping relationship to effectively define a three dimensional circuit design, adding a vertical or transverse dimension to planar dimensions of the individual circuit layers, and utilizing an inter-layer bus to communicate along the vertical direction between functional units defined within the individual circuit layers.

Figure 1:
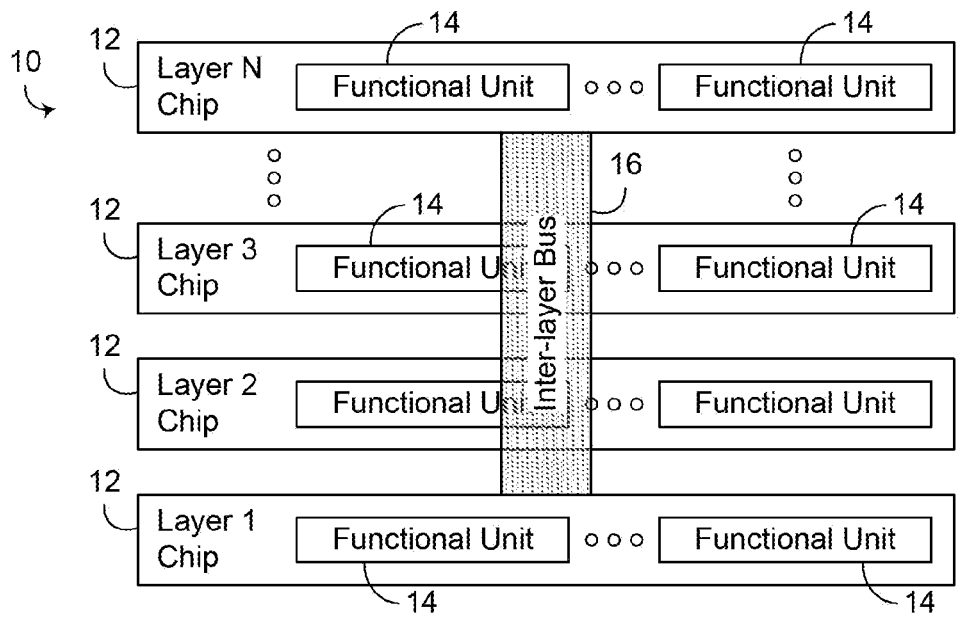
FIG. 1 is a block diagram of a multi-layer semiconductor stack incorporating an inter-layer bus consistent with the invention.

FIG. 1, for example, illustrates a multi-layer semiconductor stack 10 incorporating a plurality of semiconductor dies or chips 12, each including one or more functional units 14. Consistent with the invention, the functional units 14 on the plurality of chips 12 communicate with one another over a vertically or transversely oriented inter-layer bus 16, and are physically and electrically coupled to one another in a stacked arrangement.

Figure 2:
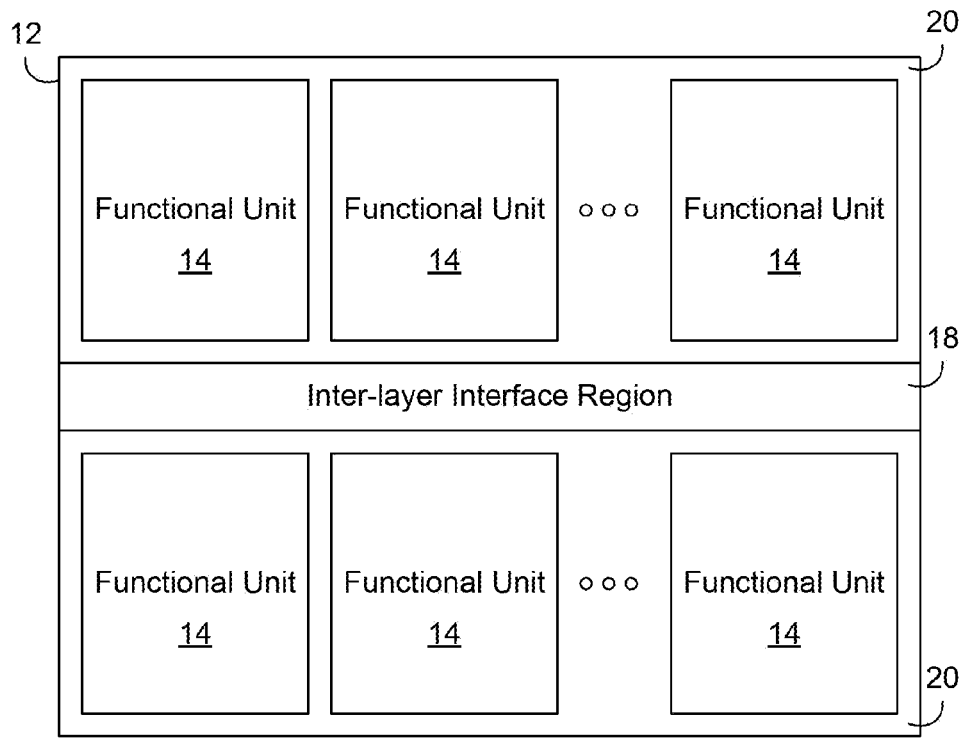
FIG. 2 is a block diagram of an exemplary circuit layer from the multi-layer semiconductor stack of FIG. 1.

As shown in FIG. 2, to implement a universal, standardized inter-layer bus, each semiconductor die 12 includes an inter-layer interface region 18 disposed at a predetermined topographic location of the die, which includes a plurality of electrical conductors (not shown in FIG. 2) disposed at predetermined locations such that, when the dies 12 are stacked together, the respective inter-layer interface regions 18, and thus the electrical conductors therein, are topographically aligned with one another (within the context of the invention, and assuming an x-y-z coordinate system where x and y refer to dimensions within the plane of a circuit and z refers a dimension perpendicular to the plane of the circuit, two features are topographically aligned when those features have substantially the same x, y coordinates when the dies upon which those features are formed are arranged together in a stack.) In many instances, due to this alignment, the interconnection of the electrical conductors within the individual dies to one another to form the inter-layer bus is an automatic occurrence resulting from the physical and electrical interconnection of the dies to one another into the stack.

It will be appreciated that an inter-layer interface region may take a number of forms depending upon factors such as the number of bus segments required, the number of interconnects required to implement the bus, the number and arrangement of functional units, and the size of the respective dies. For example, if a stack includes dies of varying sizes, the inter-layer interface regions on different dies may be differently-sized, but may nonetheless include corresponding and topographically aligned electrical conductors to implement the bus. Also, an interface region may be a single contiguous region or may be broken into multiple non-contiguous regions. Furthermore, as discussed below in connection with FIG. 8, some circuit layers in a stack may include intra-layer bus interconnections, e.g., to interconnect multiple bus segments of an inter-layer bus, such that the inter-layer interface region of one circuit layer may be a superset or subset of the inter-layer interface region of another layer.

In the illustrated embodiments, functional circuitry for a circuit layer, e.g., the functional units 14 in a circuit design, may not be placed within the inter-layer interface region, but are instead required to be placed in a functional region 20 of the die. A functional unit, in the context of the invention, generally refers to functionally-related logic circuitry that has been partitioned for functional purposes into a distinct unit. While in the illustrated embodiments, functional units are typically highly complex circuits such as processor cores, memory controllers, or accelerator units, it will be appreciated that in other embodiments, the complexity and functionality of a functional unit may be more or less complex, and that an inter-layer bus consistent with the invention may be used to enable communication of data between practically any type of logic circuitry that may be integrated into a circuit design.

Figure 3:
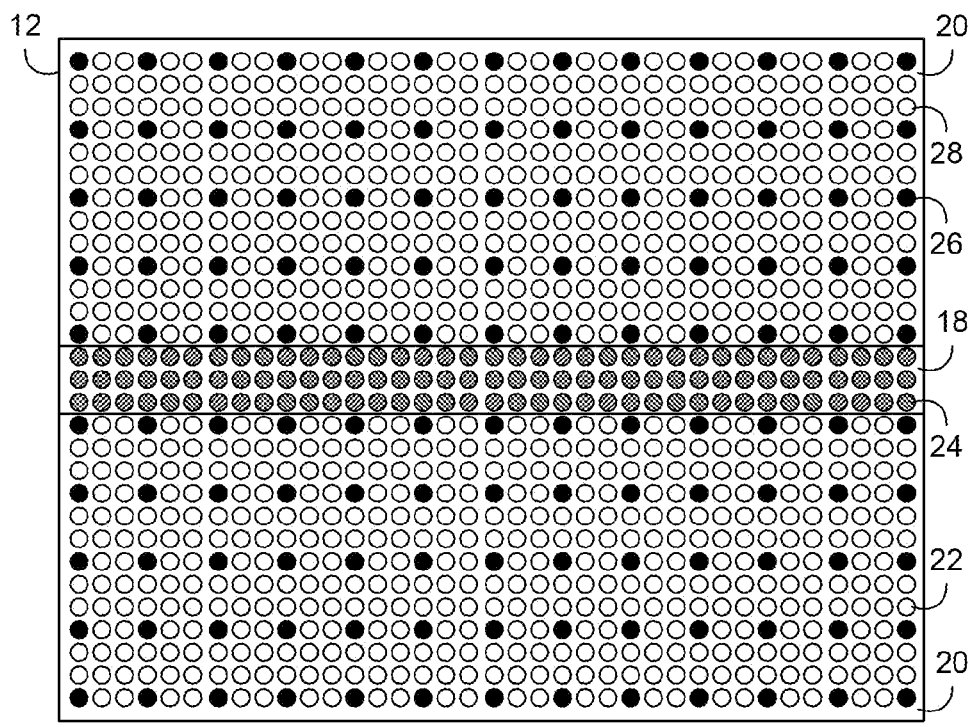
FIG. 3 is a block diagram illustrating an exemplary contact pad array for a semiconductor die in the multi-layer semiconductor stack of FIG. 1.

Turning now to FIG. 3, while not mandatory, it is typically desirable to lay out the electrical conductors in an inter-layer bus in a regular pattern that is repeatable among all circuit layers of a multi-layer semiconductor stack. In the illustrated embodiment, for example, it may be desirable to arrange the electrical conductors into a regular two dimensional array such as a rectangular array, and moreover, to integrate such an array with an array of power distribution electrical conductors that operate as the power distribution network for each semiconductor die.

FIG. 3, for example, illustrates a rectangular array of contact pads 22 disposed over the surface of a semiconductor die 12. The gray pads 24, disposed within inter-layer interface region 18, are coupled to electrical conductors for the inter-layer bus, while the black pads 26 are power distribution pads coupled to either positive voltage (VDD) or ground. The white pads 22 are dummy pads, and are electrically isolated from any active circuitry. The dummy pads, however, serve as additional mechanical connections to which adjacent semiconductor dies can be secured.

In this embodiment, the pitch of the inter-layer bus pads 24 is three times that of the power distribution pads 26, whereby within any 3×3 grid of pads in the inter-layer interface region 18 there will be nine inter-layer bus pads 24, but within any 3×3 grid of pads in the functional region 20 there will be one power distribution pad 26 and eight dummy pads 28.

In one embodiment, for example, the pitch of the inter-layer bus pads in 50 um while that of the power distribution pads is 150 um, which is compatible, for example, with conventional micro C4 bonding techniques. On, for example, a semiconductor die having contact pads distributed over a 210 mm2 (18.6 mm×11.3 mm) area, an array of 84,072 (226×372) contact pads may be provided. An inter-layer interface region configured in the manner illustrated in FIG. 3, and having a size of about 18.6 mm×0.55 mm (or a width equivalent to 11 rows of contact pads) would occupy less than 5% of the available space on the die, and would provide 4092 separate signal paths.

It will be appreciated that power distribution pads may also be disposed within inter-layer interface region in some embodiments, and that in other embodiments, some positive voltage and ground electrical conductors may be considered part of the inter-layer bus architecture, and therefore be present within the inter-layer interface region for that reason. It will further be appreciated that the distribution of positive voltage and ground contact pads may vary in different embodiments, e.g., with more or less positive voltage contact pads than ground pads, or with the power distribution pads distributed throughout the functional region in an irregular distribution pattern.

Figure 4:
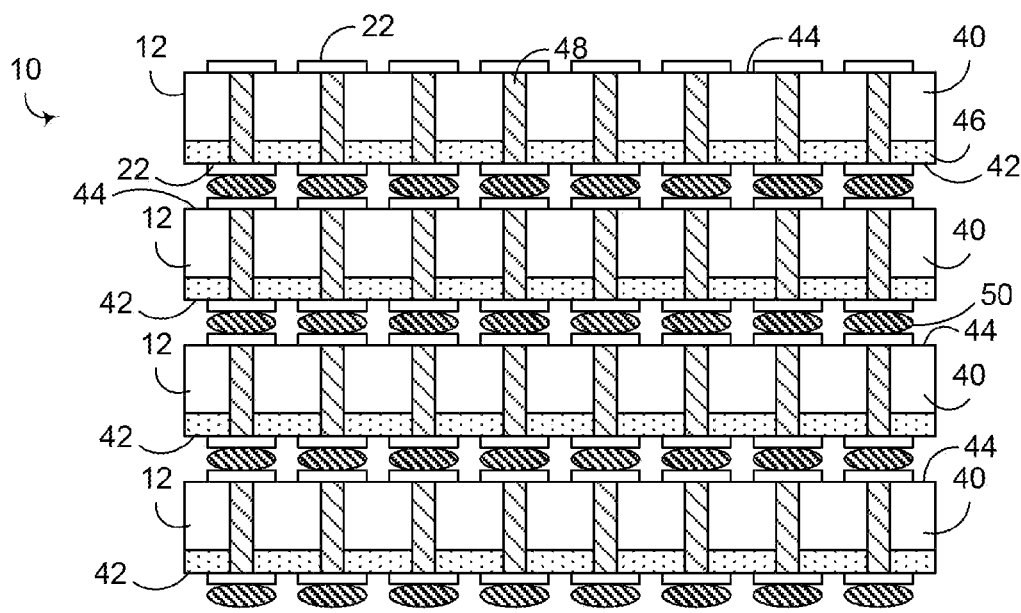
FIG. 4 is a functional cross-sectional view of the multi-layer semiconductor stack of FIG. 1.

As illustrated in FIG. 4 (which is not shown to scale), in one implementation, the semiconductor dies 12 in multi-layer semiconductor stack 10 are physically and electrically coupled to one another in a stack arrangement. Each die 12 includes a substrate 40 (e.g., a silicon substrate), and each die includes opposing surfaces or faces 42, 44, and at least one of which includes circuit logic 46 integrated thereon and defining a circuit layer for the multi-layer stack. The various manners in which integrated circuit logic may be fabricated on a surface of substrate 40 are well known to those of ordinary skill having the benefit of the instant disclosure, and therefore will not be discussed in greater detail herein.

To physically and electrically couple the semiconductor dies 12 together, and thereby join the electrical conductors for the inter-layer bus, various techniques may be used. For example, in one embodiment, each semiconductor die is fabricated on a silicon wafer of conventional thickness (e.g., about 700 um thick). The side of the wafer opposite that upon which the circuit logic is then ground and polished, e.g., to about 50 to about 70 um in thickness. A regular array of holes (e.g., at the same pitch as the regular array of contact pads, in this implementation 50 um) are formed in each die extending completely between surfaces 42, 44 (e.g., via ion etching) and a conductive material is deposited on the walls of the holes. The holes are then filled with silicon to form through silicon vias (TSV's) 48. Topographically aligned regular arrays of contact pads 22 are then formed on the opposing surfaces 42, 44 of each die 12, with the topographically aligned contact pads 22 on the opposing surfaces 42, 44 electrically coupled to one another by a respective via 48 extending between such pads 22.

It will be appreciated that TSV's may extend completely through each die 12, or some or all of the TSV's may be discontinuous through the thickness of each die. For example, in some embodiments, it may be desirable for any TSV's associated with Vdd/Gnd to extend completely through the thickness of the die, and for any TSV's associated with data-carrying signals, the data signals may enter the bottom of a single circuit layer via a contact pad 22, connect to a circuit in the circuit layer, and have the output of that circuit routed to the same topographic location and coupled to a TSV extending through the substrate of the die to the opposing contact pad 22.

In the illustrated embodiment, it is desirable to not form vias in each die that are topographically aligned with any dummy contact pads on the die. Thus, for example, it may be desirable to form a regular array of vias at the pitch of the inter-layer bus electrical conductors within the inter-layer interface region 18 of each die (in this embodiment, 50 um), but form a regular array of vias at the pitch of the power distribution conductors in the functional region 20 (in this embodiment, 150 um). By doing so, the area in the functional region of the active circuit layer that would otherwise be occupied by vias is available for functional circuitry.

Once the contact pads are formed on the opposing surfaces of the semiconductor dies 12, the dies 12 may be separated from the wafer and physically and electrically coupled to one another in a stacked arrangement using any of a number of different types of chip bonding techniques, e.g., compression soldering or micro C4 (Controlled Collapse Chip Connection), resulting in the formation of a regular array of physical/electrical interconnects 50 joining contact pads 22 on adjacent surfaces 42, 44 of adjacent semiconductor chips 12. Additional manufacturing steps, e.g., mounting the stack 10 to a carrier or package, applying thermal grease, attaching a heat sink, encapsulating the stack, etc. may also be performed to complete the assembly.

While each semiconductor die 12 is illustrated as including contact pads on both surfaces, with a single circuit layer deposed on one of the surfaces, and with all dies oriented such that the active layer of each die faces downward, it will be appreciated that alternative arrangements may be used in other embodiments. For example, different die interconnection technologies can be used for different dies within the same stack, and dies disposed at the top or bottom of a stack may be configured differently from other dies in the stack. As an example, an end (or top) die in a stack may not include vias, and may simply include contact pads coupled directly to the active circuitry on the single face of the die. In many embodiments, it is desirable, however, for the end dies to include vias and contact pads on the opposite face from the active circuitry, as the conductive material in the vias may operate in much the same manner as a heat pipe, given that the conductive vias and contact pads are topographically aligned through the entire thickness of the stack.

As another example, active circuitry may be integrated onto both surfaces of a semiconductor die, or a dual sided semiconductor die may be formed by wafer bonding two semiconductor substrates together either face to face or back to back. As yet another example, alternate dies in a stack may be flipped to orient the active circuitry on particular semiconductor dies either closer or farther away from the active circuitry on adjacent semiconductor dies.

It will also be appreciated that a number of alternate fabrication, packaging, and manufacturing techniques, which are either currently known or which may hereinafter be developed, may be utilized to manufacture a multi-layer semiconductor stack consistent with the invention. The invention is therefore not limited to the particular techniques described herein.

Figure 5:
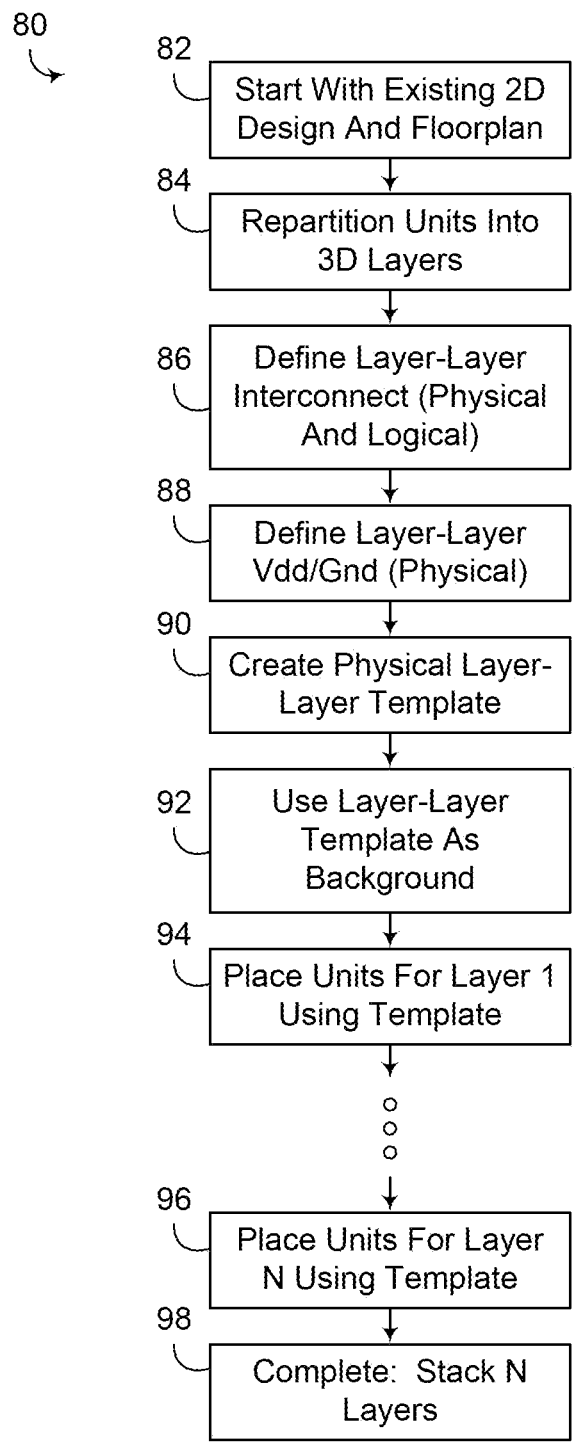
FIG. 5 is a flowchart illustrating a process for redesigning a single circuit layer design for implementation in a multi-layer semiconductor stack in a manner consistent with the invention.

FIG. 5 next illustrates an exemplary design process 80 that may be utilized to design a circuit arrangement for a multi-layer semiconductor stack in a manner consistent with the invention. In this implementation, an existing single circuit layer design, also referred to herein as a two dimensional design, is redesigned or adapted into a three dimensional design suitable for implementation in a multi-layer semiconductor stack. It will be appreciated, however, that other design methodologies may be employed, and that the design of three dimensional or multi-layer semiconductor stack designs need not be based upon preexisting two dimensional designs. The invention is therefore not limited to the particular design methodology utilized herein.

Process 80 begins in block 82 by starting with an existing two dimensional design and general floorplan. The circuit logic in a design typically is organized into multiple functional units, where each functional unit includes circuit logic that is functionally related toward performing a common computational task. Additional support circuitry that may not have any particular high level task, but that is otherwise required for the operation of the design, may also be considered to be organized into a functional unit for the purposes of process 80, and it may be desirable to group together circuit logic that is otherwise unrelated but capable of being laid out in the same general region as a functional unit to facilitate the redesign process. In the example described below, for example, it may be desirable to group together much of the circuitry that is otherwise not dedicated to a particular processing core or accelerator unit to one or more I/O functional units that handle ancillary tasks such as external drivers and interfaces, networking, testing, debugging, clock and/or power distribution, memory control, etc.

Next, in block 84, the functional units in the single circuit layer, two dimensional design are repartitioned into N circuit layers. While various alternative methodologies may be used, it is typically desirable to group together functionally-related functional units on the same circuit layer. Moreover, in situations where multiple instances of a given functional unit are present in a design, it may be desirable to locate all of those instances on the same circuit layers. For example, in design incorporating multiple processing cores, it may be desirable to allocate those processing cores to the same layers.

Next, in block 86, the inter-layer interconnect or bus is defined, both from a physical and logical standpoint. Specifically, the dimensions and location of the inter-layer interface region on each circuit layer, as well as the specific locations of the vias and electrical conductors for the bus within that region, are determined. Similarly, in block 88, the layer-layer power distribution network (Vdd/Gnd) is determined, thereby designating the locations of the positive voltage and ground vias.

Next, in block 90, a physical layer-layer template is created, using the inter-layer bus electrical conductor locations and power distribution network locations to block out the appropriate regions for the vias and provide contact points to which logic circuitry on each circuit layer can be electrically coupled. In addition, the template may be provided with standardized bus interface logic to facilitate interconnection of functional unit circuitry to the inter-layer bus.

Next, as illustrated in blocks 92-96, the created template may then be used as a background for each circuit layer in the multi-layer design, by placing the functional units allocated to those layers in the respective layer designs and coupling those functional units to the inter-layer bus and power distribution network defined by the background template. As shown in block 98, once each layer is designed, the N layers may be stacked for the purposes of testing and simulation, and the design is then suitable for fabrication and manufacture.

Typically, the placement of functional units in the circuit layer designs, as well as the interconnection of functional units to the signal paths of the inter-layer bus, are performed by software-based circuit design tools responsive to user input from a circuit designer. The design process results in the generation of one or more design files, from which a design may be tested, simulated, debugged and ultimately used during a fabrication process to manufacture multi-layer semiconductor stacks consistent with the invention.

Figure 6:
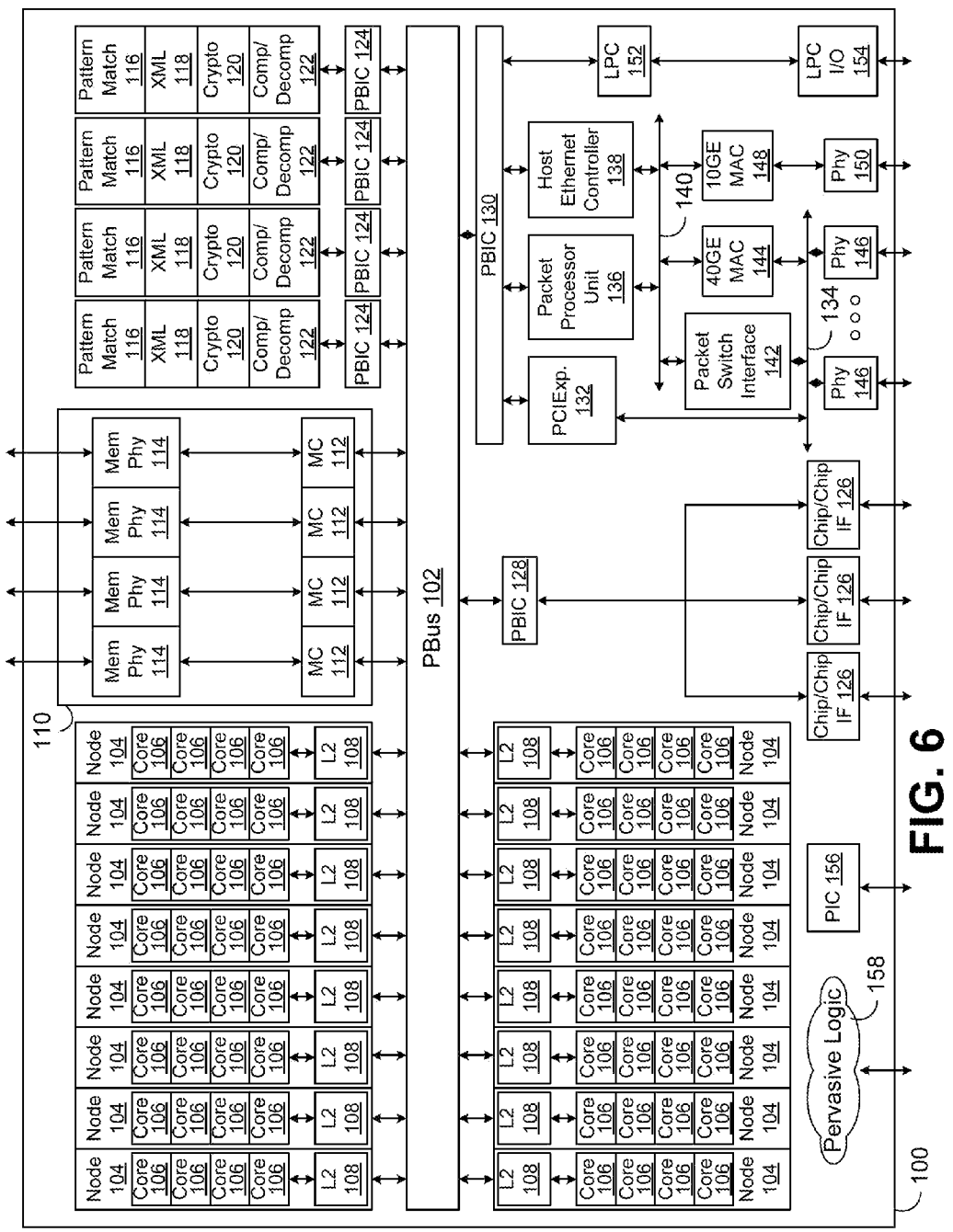
FIG. 6 is a block diagram illustrating an exemplary single circuit layer design capable of being redesigned by the process of FIG. 5.

FIGS. 6-11 further illustrate by way of example the process illustrated in FIG. 5. FIG. 6, in particular, illustrates an exemplary two dimensional design 100 for a multi-core networking device. Design 100 includes a system bus 102 to which a plurality of functional units are coupled to one another, as well as to other support and interface logic in the design. System bus 102 may be implemented, for example, using the PowerBus or PBus bus architecture used in connection with the Power processor architecture available from International Business Machines Corporation, among others.

Design 100 includes a plurality (e.g., 16) of nodes 104, with each node 104 including a plurality (e.g., four) of processing cores 106 coupled to a shared L2 cache 108. Each processing core 106, for example, may be implemented as a Power architecture compatible core.

Design 100 also includes memory controller logic 110 including a plurality (e.g., four) of memory controller blocks 112, each having a cooperative physical memory interface block 114 for coupling to off-chip memory. Design 100 also includes a set of accelerator blocks providing specialized logic for accelerating various functions required in the design, e.g., pattern matching (blocks 116), XML processing (blocks 118), cryptography (blocks 120) and compression/decompression (blocks 122). The accelerator blocks 116-122 are grouped into four groups, with each group interfaced with system bus 102 with an associated bus interface logic (PBIC) block 124.

Three chip/chip interface blocks 126 provide chip-to-chip communication, and are coupled to the system bus 102 by an associated PBIC block 128, while another PBIC block 130 couples a number of additional networking and interface logic blocks to system bus 102. Specifically a PCI Express block 132 couples to an on-chip PCI bus 134, while a packet processor unit 136 and host Ethernet controller block 138 are coupled to an on-chip bus 140. A packet switch interface block 142 and 40 Gigabit Ethernet Media Access Control block 144 are coupled between buses 134 and 140, and multiple physical interface blocks 146 are coupled to bus 134 to communicate with external (off-chip) devices. A 10 Gigabit Ethernet Media Access Control block 148 is also coupled to bus 134 and interfaced off-chip by a physical interface block 150. A low pin count (LPC) block 152 is also interfaced with system bus 102 via PBIC 130, and is coupled to an LPC IO block 154. Additional circuit logic, e.g., a programmable interrupt controller (PIC) block 156 and pervasive logic 158, among additional support logic that is not otherwise illustrated in FIG. 6, may also be included in circuit design 100. Pervasive logic 158 may include, for example, JTAG, performance monitor, clock controller, POR and error control logic.

Figure 7:
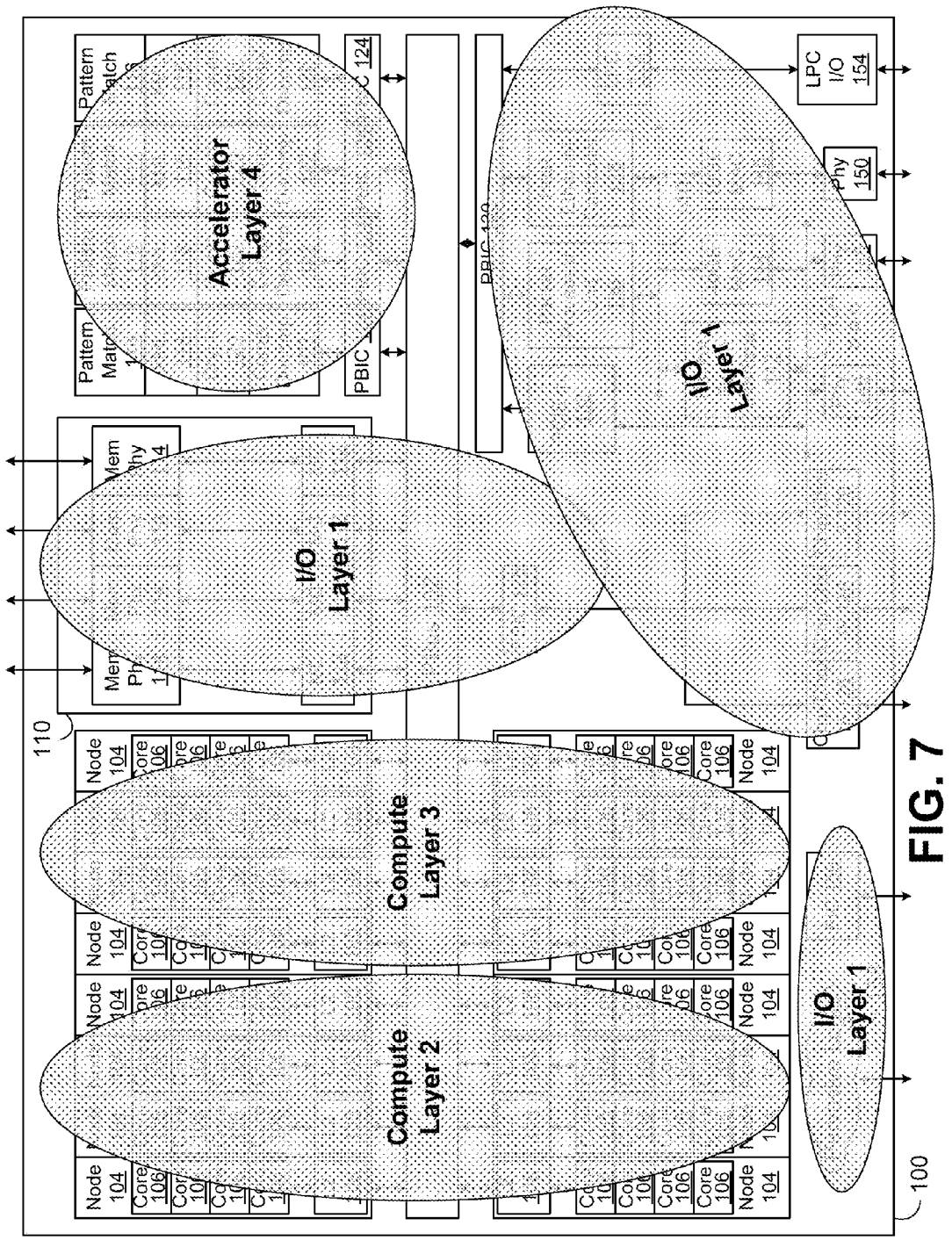
FIG. 7 is a block diagram of the single circuit layer design of FIG. 6, illustrating the mapping of functional units in the single circuit layer design to multiple circuit layers.

To redesign circuit design 100 for use in a multi-layer semiconductor stack, functional units in design 100 are repartitioned into multiple circuit layers, as described above in connection with block 84 of FIG. 5. FIG. 7, for example, illustrates the partitioning of functional units in circuit design 100 into four circuit layers. In this example, a first layer, designated I/O Layer 1, is used for memory controllers, network and interface logic, pervasive logic and other support logic, including any other logic required to implement off-chip communications. The sixteen processing nodes 104 (incorporating a total of 64 processing cores) are allocated to two compute layers, designated as Compute Layers 2 and 3, and the accelerator blocks 116-122 are allocated to a separate accelerator layer, designated Accelerator Layer 4, resulting in a total of four separate circuit layers.

Figure 8:
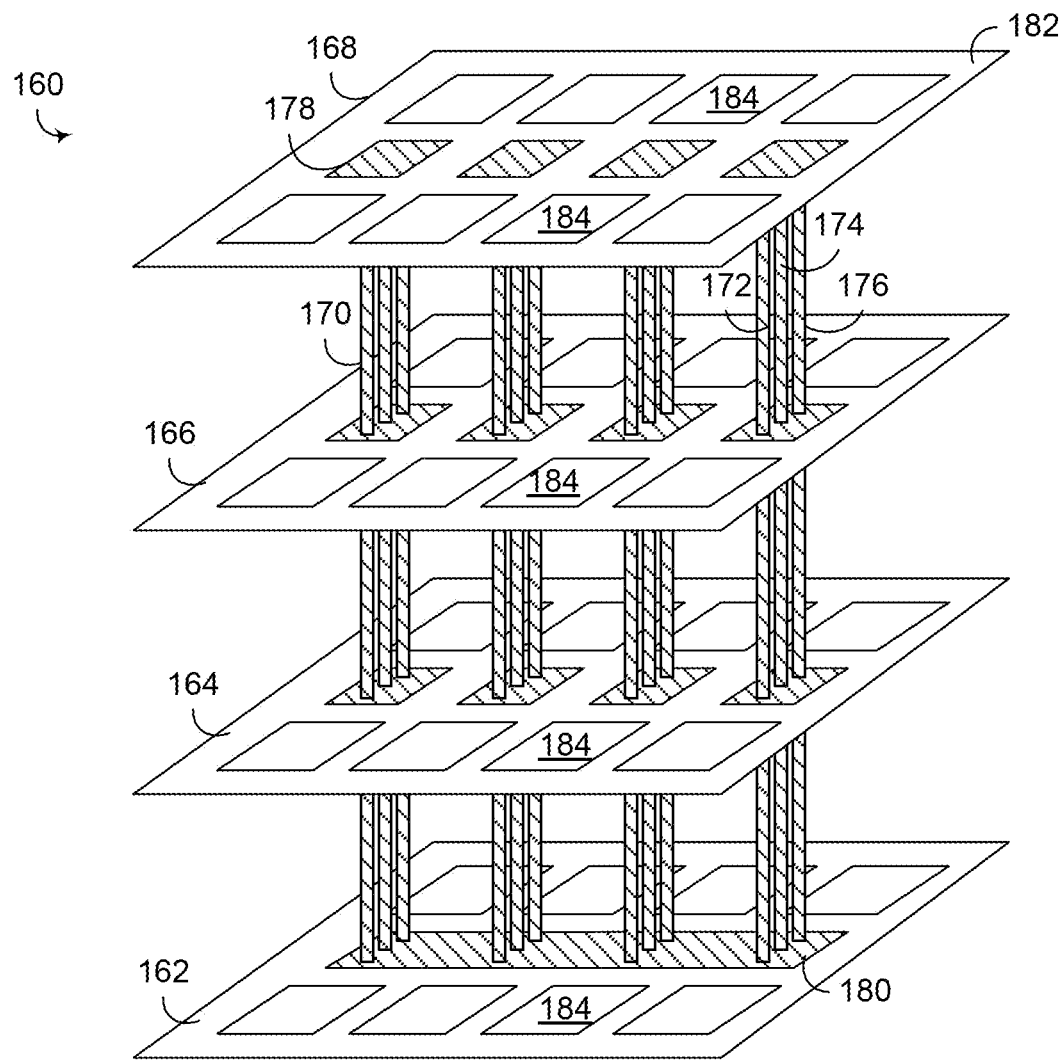
FIG. 8 is a functional exploded perspective view of a multi-layer semiconductor stack implementation of the single circuit layer design of FIG. 6.

Next, as described above in connection with block 86 of FIG. 5, the layer-layer or inter-layer interconnect is defined. For example, FIG. 8 illustrates an exemplary multi-layer circuit design 160 including four layers 162, 164, 166 and 168, respectively corresponding to I/O Layer 1, Compute Layer 2, Compute Layer 3 and Accelerator Layer 4.

In this implementation, the inter-layer bus 170 is defined with four segments. In this implementation, a PowerBus architecture compatible bus is used, which includes separate command and data buses (illustrated at 172 and 174) and pervasive interconnects (illustrated at 176). In one embodiment, for example, a PowerBus data bus may include 2560 signal paths providing an 8×32B wide data bus and 210 signal paths providing a command bus (including 46 address bits, 17 Ttag bits, 6 Ttype bits, 7 Tsize bits, 10 snoop bits, 40 combined response bits). An additional 40 to 80 signal paths may be used to provide pervasive signal paths, e.g., LBIST channels, an ABIST interface, trace and performance monitor signal paths, power on reset signal paths, error status signal paths, interrupt signal paths, clock control paths, local clock buffer (LCB) signal paths, etc. It will be appreciated, however, that the allocation of signal paths and interconnects to an inter-layer bus may vary in different embodiments, so the invention is not limited to the particular allocation described herein.

In this implementation, the partitioning of functional units to layers in the multi-layer design is used to implement a plurality of vertically-oriented "supernodes" or slices that are independently operating from one another, though distributed across the same layers of the design. In particular, four supernodes are defined, each including four compute nodes, two of which in each compute layer 164, 166, and a dedicated set of accelerator blocks in accelerator layer 168. The respective bus segments in inter-layer bus 170 are dedicated to each supernode, and as a result, four separate inter-layer interface regions 178 are defined on each of layers 164, 166 and 168. The supernodes, however, share I/O resources on layer 162, as well as communicate with one another via an intra-layer bus interconnected the bus segments, and as a result, the inter-layer interface region 180 of layer 162 may be shared and additionally include logic to logically join the respective bus segments to one another. The regions outside of the respective inter-layer interface regions 178, 180 of layers 162-168 are functional regions 182, within which functional units, generically represented at 184, may be placed.

Figure 9:
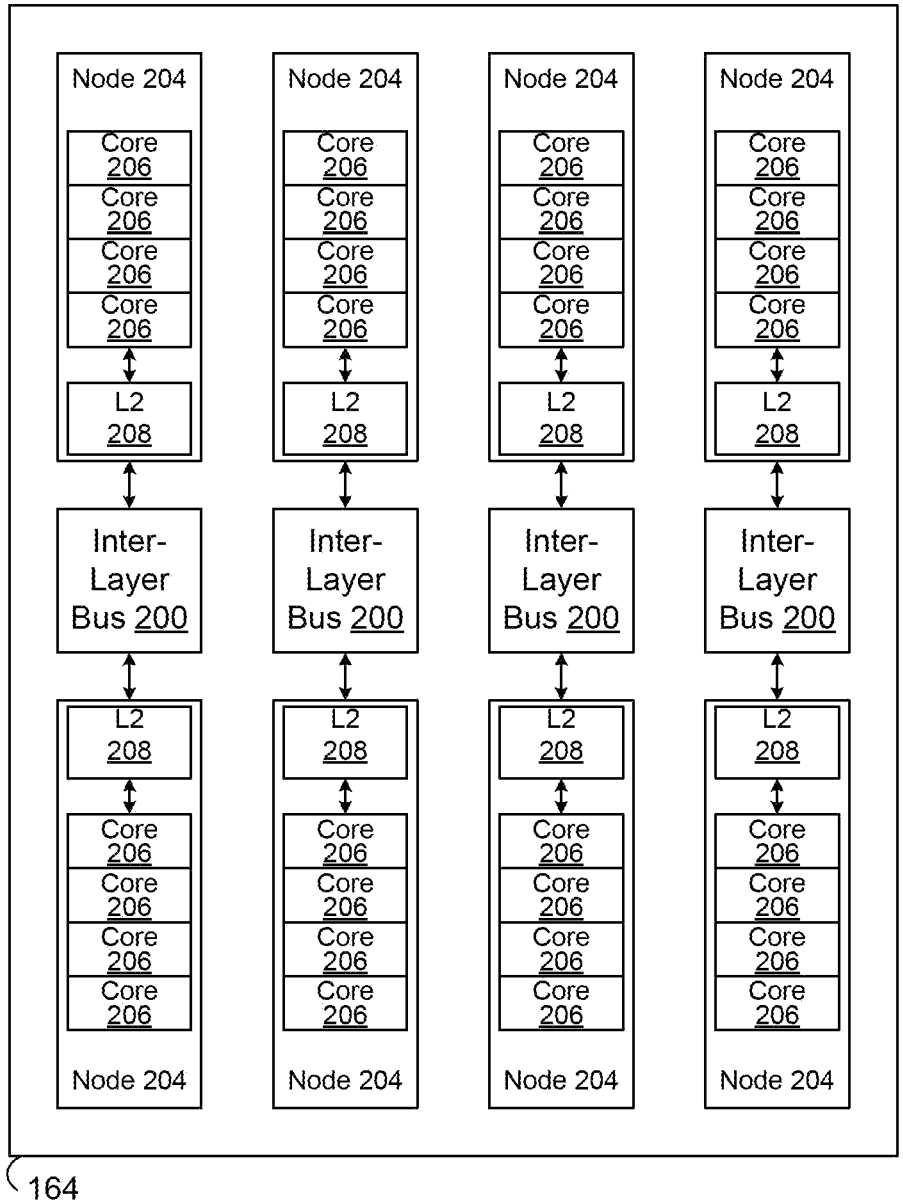
FIG. 9 is a block diagram of a compute circuit layer from the multi-layer semiconductor stack of FIG. 8.

Once the layer-layer interconnect has been defined, as described above in connection with FIG. 5, a template is created and used as a background for the design of the individual circuit layers. In the implementation of FIGS. 8-11, two separate templates are used, a first for the compute and accelerator layers 164, 168 (since these layers include four separate bus segments) and a second for the I/O layer 162 (since the four bus segments are effectively joined in this layer). FIG. 9, for example, illustrates one suitable layout for compute layer 164 is illustrated, which may also be suitable for compute layer 166 as well. In FIG. 9, as well as in FIGS. 10-11, it will be appreciated that the blocks or functional units numbered 2xx typically correspond to the blocks or functional units numbered 1xx in the two dimensional circuit design of FIG. 6, and that in many instances, the blocks or functional units from the two dimensional design may simply be reused in the three dimensional multi-layer semiconductor stack design.

In this layout, each supernode includes two compute nodes 204, each with four processing cores 206 and a shared L2 cache 208, and coupled to inter-layer bus logic 200 for the associated bus segment for the supernode. It will be appreciated that with two compute layers configured in the manner illustrated in FIG. 9, each supernode will have a total of four compute nodes 204 allocated thereto.

Figure 10:
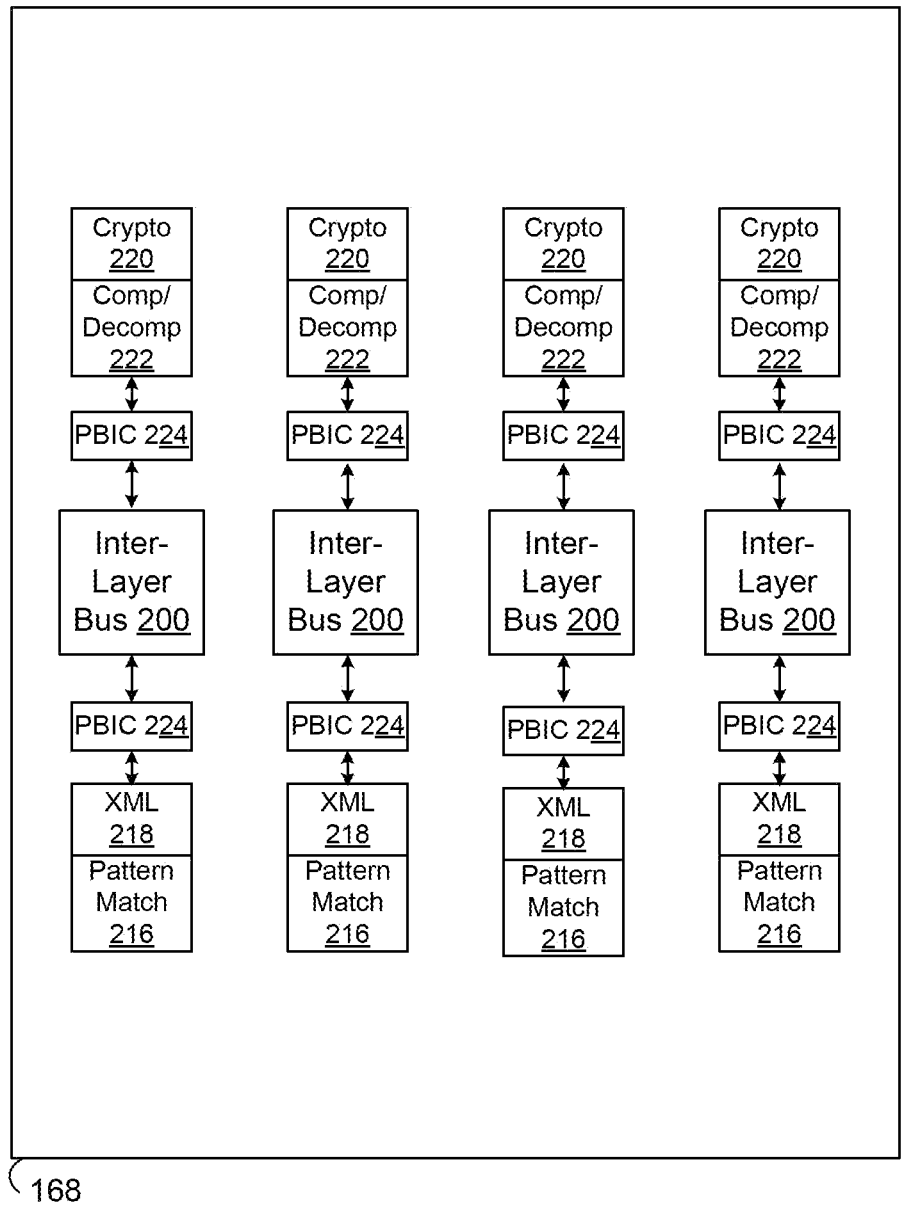
FIG. 10 is a block diagram of an accelerator circuit layer from the multi-layer semiconductor stack of FIG. 8.

FIG. 10 illustrates one suitable implementation of accelerator layer 168, including connections to inter-layer bus segments 200, and with each supernode being allocated respective accelerator blocks, including a pattern matching block 216, XML processing block 218, cryptography block 220 and compression/decompression block 222. Each supernode also includes associated bus interface logic (PBIC) blocks 224 to interface the respective accelerator blocks with the inter-layer bus.

Figure 11:
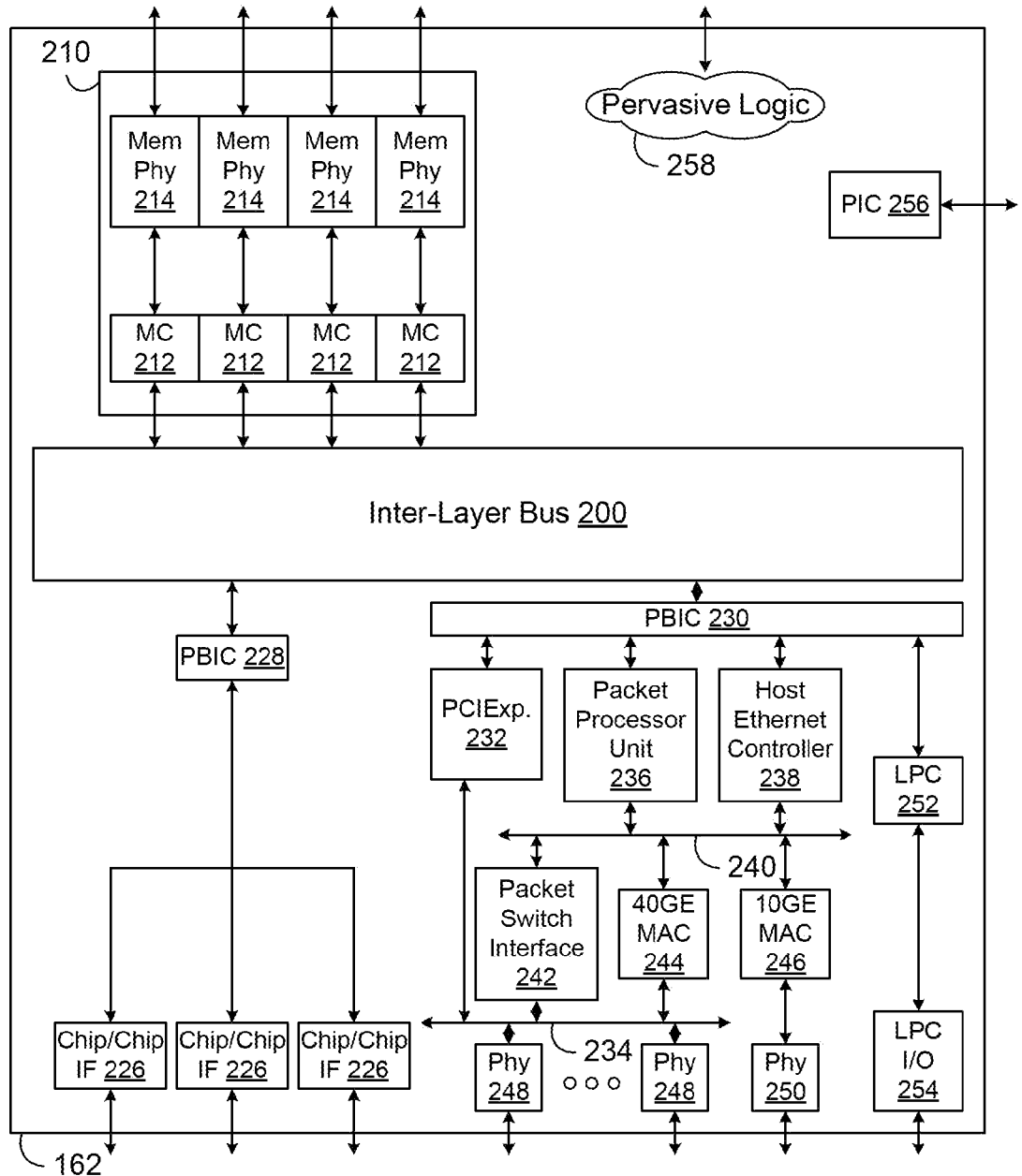
FIG. 11 is a block diagram of an I/O circuit layer from the multi-layer semiconductor stack of FIG. 8.

FIG. 11 illustrates one suitable implementation of I/O layer 162, including a portion of inter-layer bus 200 that additionally includes one or more intra-layer buses to interconnect the four inter-layer bus segments and thereby allow each supernode to access the functional units on I/O layer 162, as well as to communicate with one another.

As noted above, an inter-layer bus consistent with the invention may be implemented in a number of manners. Typically, an inter-layer bus will include both functional signal paths associated with the communication of data over the bus, as well as additional support or pervasive signal paths, including, for example, power distribution signal paths, clock distribution signal paths, testing/debugging signal paths, interrupt signal paths, reset signal paths, etc. The functional signal paths may implement any number of bus implementations, including those implementing separate command, address and data signal paths, or those in which command, address and/or data is communicated over the same signal paths. Various bus or network architectures, e.g., point-to-point, switched, multi-drop, etc., may also be implemented, and control logic may be utilized in the architecture to partition the inter-layer bus into multiple segments so that all functional units coupled to the bus are not required to share the same bandwidth. While the term "bus" is utilized herein, it will be appreciated that an inter-layer bus may include practically any networking architecture that enables multiple logical units in a circuit design to communicate with one another, and that an inter-layer bus architecture may include various buffers, controllers, switches, routers, etc. as may be required to implement the desired networking architecture. Furthermore, in some embodiments, circuit layers may be designated as source, termination and/or interior layers, with differing bus control logic implemented in each such layer to provide appropriate bus source and termination logic for a given bus architecture. It may be desirable, for example, to utilize one or more master bus controllers on I/O layer 162 to manage the communication of data over each bus segment.

The integration of pervasive signal paths into an inter-layer bus architecture provides an additional benefit in terms of distributing the pervasive logic of a circuit design throughout the multi-layer semiconductor stack, since the mere process of aligning the semiconductor dies into the stack and bonding them together not only forms the inter-layer bus, but also distributes the pervasive logic, including both clocking and test/debug logic, throughout the multiple circuit layers. Furthermore, an additional benefit is realized during manufacture since the standardized locations of the pervasive signal paths within the inter-layer interface region of each semiconductor die enables the individual semiconductor dies to be tested individually once the contact pads are formed on the dies, and moreover, once the semiconductor dies are bonded into the stack, the same contact pads on one of the exterior semiconductor dies can be used to perform additional global testing of the entire bonded stack.

Figure 12:
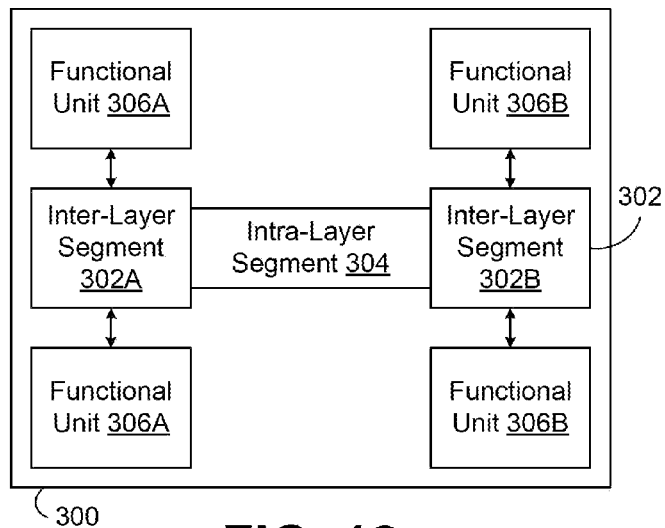
FIG. 12 is a block diagram of another multi-layer semiconductor stack implementation, illustrating the use of multiple bus segments for an inter-layer bus consistent with the invention.

In addition, an inter-layer bus may include portions that are intra-layer, e.g., to interconnect multiple bus segments that are topographically offset from one another in the stack. FIG. 12, for example, illustrates an exemplary multi-layer semiconductor stack 300 in which an inter-layer bus 302, including two inter-layer bus segments 302A and 302B, additionally includes an intra-layer bus segment 304 to enable functional units 306A coupled to inter-layer bus segment 302A to communicate with functional units 306B coupled to the other inter-layer bus segment 302B. In this implementation, networking logic may be utilized between each segment 302A, 302B and 304 to localize the bandwidth of each inter-layer segment 302A, 302B, and intra-layer segment 304 is used only to relay communications from one inter-layer bus segment 302A, 302B that are addressed to a functional unit on the other inter-layer bus segment 302A, 302B. In other embodiments, however, an inter-layer bus may be global where all functional units share the same bandwidth, or multiple inter-layer buses, which are completely isolated from one another, may be implemented in a given multi-layer semiconductor stack.

Figure 13:
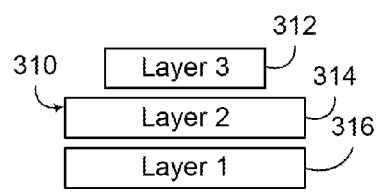
FIG. 13 is a block diagram of yet another multi-layer semiconductor stack implementation, illustrating the use of differently-sized semiconductor dies.

Another benefit of a standardized or universal inter-layer bus architecture is that the individual circuit layers and semiconductor dies within a given stack may be of different dimensions and/or compositions. For example, as shown in FIG. 13, a multi-layer semiconductor stack 310 consistent with the invention may include one or more semiconductor dies such as die 312 that are differently sized than other semiconductor dies 314, 316 in the stack. So long as the contact pads for the inter-layer bus are topographically aligned when the dies are bonded into a stack, the physical dimensions of the individual dies may be independent from one another.

Figure 14:
FIG. 14 is a block diagram of still another multi-layer semiconductor stack implementation, illustrating the use of semiconductor dies incorporating different semiconductor fabrication design rules.

As another example, as shown in FIG. 14, a multi-layer semiconductor stack 320 consistent with the invention may include one or more semiconductor dies such as die 322 that are designed and fabricated using different semiconductor fabrication design rules than other semiconductor dies 324, 326 in the stack. Die 322, in particular, is illustrated as being fabricated using a 45 nm process, while dies 324, 326 are illustrated as being fabricated using a 32 nm process. So long as the contact pads for the inter-layer bus are topographically aligned when the dies are bonded into a stack, the feature sizes for the logic circuits on each individual dies may be independent from one another. In addition, this configuration allows for the possibility that certain legacy layers may be reused with newer, more advanced layers. For example, in the circuit design of FIG. 8, a new, higher performance version of a compute layer, fabricated using a smaller feature size, may be substituted for a legacy compute layer, with the accelerator and I/O layers from the prior generation reused in the new multi-layer semiconductor stack.

Furthermore, the methodology described herein, wherein functional units having common functionality may be allocated to particular circuit layer, enables a substantial amount of flexibility in terms of design reuse. For example, the basic multi-layer design 160 described above in connection with FIGS. 8-11, which includes separate I/O, compute, and accelerator layers 162, 164/166, 168, could be used to implement an entire family of products simply by mixing and matching semiconductor dies for different functional layers in different semiconductor stacks. A common I/O layer 162 may be used as a starting point for all variations, including, for example:

low power—I/O layer, 1 compute layer
    low power+accelerator—I/O layer, 1 compute layer, 1 accelerator layer
    medium power—I/O layer, 2 compute layers
    medium power+accelerator—I/O layer, 2 compute layers, 1 accelerator layer
    high power—I/O layer, 3 compute layers
    high power+accelerator—I/O layer, 3 compute layers, 1 accelerator layer Also, by providing different accelerator layers, various types of specialized devices may be built from the same general purpose computing platform. For example, accelerator layers including appropriate acceleration hardware may be used to optimize a device for particular applications, e.g.

networking, graphics processing, cryptography, etc Likewise, different alternative layers having different power consumption characteristics may be used in different variations to enable the same platform to be used for both high performance/high power and low performance/low power applications. In addition, the techniques described herein may be used to provide different levels and/or sizes of cache memories for different variations so that, for example, applications requiring additional cache memory may utilize a larger cache memory implemented across several circuit layers, or multiple levels of cache.

The use of independent circuit layers may also provide the ability to utilize different types of circuits on different layers, e.g., to include FPGA's on certain layers. In addition, independent circuit layers may enable specialized circuitry requiring non-uniform characteristics to be isolated to a single layer, e.g., to account for off-chip drivers, varying voltages, passive or analog components, voltage regulation circuits. In some embodiments, specialized layers may be also be used solely for testing/debugging purposes or prototyping, which layers are then replaced by different operational layers once a particular design goes into production.

As noted above, another advantageous aspect of the configuration illustrated in FIGS. 8-11 is that of vertically slicing each circuit layer and utilizing multiple instances of the same logic on each circuit layer such that the individual instances form vertically-oriented supernodes that are interfaced with one another in the I/O layer, but that are otherwise independently operating units. The configuration of FIGS. 8-11 is effectively a collection of four independent processors, each including 16 processing cores, a dedicated L2 cache and a dedicated set of accelerators.

It is desirable in many embodiments, for example, to define multiple independently operating vertically-oriented supernodes that are functional duplicates of one another, e.g., to define multiple circuits that, from the standpoint of an external circuit interfacing with such circuits, operate in substantially the same manner as one another (e.g., analogous to integrating multiple processor chips into the same integrated circuit). Furthermore, in some embodiments, it is desirable for ease of design, fabrication and testing to implement the multiple supernodes using the same instances of functional units, e.g., so that for each circuit layer in which a functional unit is defined for one of the vertically-oriented supernodes, a corresponding instance of such functional unit is defined in such circuit layer for each of the plurality of vertically-oriented supernodes. Thus, for example, each compute layer 164, 166 is illustrated with eight instances of a compute node 204, with two such instances allocated to each vertically-oriented supernode, while accelerator layer 168 is illustrated with multiple instances of accelerator blocks, including a pattern matching blocks 216, XML processing blocks 218, cryptography blocks 220 and compression/decompression blocks 222, with separate instances allocated to each supernode. It will be appreciated that in some embodiments, functionally-identical instances allocated to different supernodes may also be identical from the standpoint of the circuit logic used to implement such instances, while in other embodiments, concerns such as optimizing the physical layout of a circuit design may necessitate that functionally-identical instances be implemented using non-identical underlying circuit logic.

Furthermore, due to the vertical orientation of the circuitry within each supernode, the supernode is more spatially compact than it would otherwise be if implemented on a single circuit layer, and less affected by signal propagation delays between the functional units within the supernodes. Assume, for example, that each node 204 in compute layers 164, 166 was implemented in a 7 mm×7 mm (7000 um×7000 um) area. Were two nodes that otherwise communicated through the inter-layer bus (assuming a 70 um layer thickness) laid out side-by-side on the same layer and forced to communicate intra-layer, the lengths of the signal paths would be at least an order of magnitude longer, and thus require a slower data transmission rate to account for the additional propagation delay that would be present in those signal paths. Likewise, for larger cache memories, orienting those cache memories in a separate layer may orient those memories closer to the processing logic than would otherwise occur if laid out side-to-side.

It will be appreciated that the circuit layer designs described herein may be implemented as generic gate netlists, or in other ways as may occur to those of skill in the art. A netlist is a Boolean-algebra representation (gates, standard cells) of an circuit's logical-function, analogous to an assembly-code listing for a high-level program application. Circuit layer designs also may be implemented, for example, in synthesizable form, described in a hardware description language such as Verilog or VHDL. In addition to netlist and synthesizable implementation, circuit layer designs also may be delivered in lower-level, physical descriptions. Analog elements such as SERDES, PLL, DAC, ADC, and so on, may be distributed in a transistor-layout format such as GDSII. Digital elements of circuit layer designs are sometimes offered in layout format as well. It will also be appreciated that circuit layer designs, as well as other logic circuitry implemented consistent with the invention may be distributed in the form of computer data files, e.g., logic definition program code, that define at various levels of detail the functionality and/or layout of the circuit arrangements implementing such logic. Thus, while the invention has and hereinafter will be described in the context of circuit arrangements implemented in fully functioning integrated circuit devices and stacked arrangements of such devices, data processing systems utilizing such devices, and other tangible, physical hardware circuits, those of ordinary skill in the art having the benefit of the instant disclosure will appreciate that the invention may also be implemented within a program product, and that the invention applies equally regardless of the particular type of computer readable or signal bearing media being used to distribute the program product. Examples of computer readable or signal bearing media include, but are not limited to, physical, recordable type media such as volatile and nonvolatile memory devices, floppy disks, hard disk drives, CD-ROMs, and DVDs (among others), and transmission type media such as digital and analog communication links.

Figure 15:
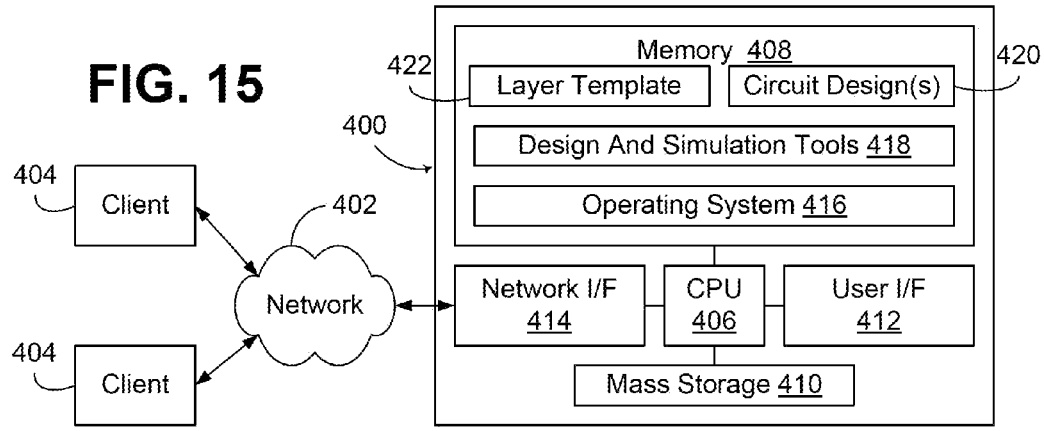
FIG. 15 is a block diagram of a computer system suitable for designing a multi-layer semiconductor stack implementation in a manner consistent with the invention.

It will also be appreciated that the aforementioned design processes may be performed at least in part using computerized design and simulation tools. FIG. 15, for example, illustrates an apparatus 400 within which the various steps in a design process may be performed. Apparatus 400 in the illustrated embodiment is implemented as a server or multi-user computer that is coupled via a network 402 to one or more client computers 404. For the purposes of the invention, each computer 400, 404 may represent practically any type of computer, computer system or other programmable electronic device. Moreover, each computer 400, 404 may be implemented using one or more networked computers, e.g., in a cluster or other distributed computing system. In the alternative, computer 400 may be implemented within a single computer or other programmable electronic device, e.g., a desktop computer, a laptop computer, a handheld computer, a cell phone, a set top box, etc.

Computer 400 typically includes a central processing unit 406 including at least one microprocessor coupled to a memory 408, which may represent the random access memory (RAM) devices comprising the main storage of computer 400, as well as any supplemental levels of memory, e.g., cache memories, non-volatile or backup memories (e.g., programmable or flash memories), read-only memories, etc. In addition, memory 408 may be considered to include memory storage physically located elsewhere in computer 400, e.g., any cache memory in a processor in CPU 406, as well as any storage capacity used as a virtual memory, e.g., as stored on a mass storage device 410 or on another computer coupled to computer 400. Computer 400 also typically receives a number of inputs and outputs for communicating information externally. For interface with a user or operator, computer 400 typically includes a user interface 142 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 400 may also include one or more mass storage devices 410, e.g., a floppy or other removable disk drive, a hard disk drive, a direct access storage device (DASD), an optical drive (e.g., a CD drive, a DVD drive, etc.), and/or a tape drive, among others. Furthermore, computer 400 may include an interface 414 with one or more networks 402 (e.g., a LAN, a WAN, a wireless network, and/or the Internet, among others) to permit the communication of information with other computers and electronic devices. It should be appreciated that computer 400 typically includes suitable analog and/or digital interfaces between CPU 406 and each of components 408, 410, 412 and 414 as is well known in the art. Other hardware environments are contemplated within the context of the invention.

Computer 400 operates under the control of an operating system 416 and executes or otherwise relies upon various computer software applications, components, programs, objects, modules, data structures, etc., as will be described in greater detail below. For example, the processes described herein may be performed with the assistance of various design and simulation tools 418, which may receive as input, and generate as output, one or more circuit designs 420. In addition, as noted above, layer templates 422 may be used to facilitate the design of circuit layers incorporating features suitable for implementing a universal or standardized interlayer bus. Moreover, various applications, components, programs, objects, modules, etc. may also execute on one or more processors in another computer coupled to computer 400 via network 402, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while aspects of the invention has been described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution.

In addition, various program code described herein may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Embodiments consistent with the invention may also utilize any of the various thermal enhancement techniques disclosed in U.S. patent application Ser. No. 12/855,854, filed on Aug. 13, 2010 by Bartley et al., which application is incorporated by reference herein.

Hybrid Bonding of Semiconductor Dies in a Multi-Layer Semiconductor Stack

Embodiments of the invention are also directed to a hybrid bonding technique that combines wafer-wafer bonding with chip-chip and/or chip-wafer bonding to form multi-layer semiconductor stacks of three or more semiconductor dies. Typically, one or more sub-assemblies formed from pairs of semiconductor dies are formed using wafer-wafer bonding, and thereafter, chip-chip and/or chip-wafer bonding is used to bond multiple wafer-wafer bonded sub-assemblies and/or individual semiconductor dies together to form a hybrid-bound semiconductor stack comprising three or more semiconductor dies.

Wafer-wafer bonding, within the context of the invention, incorporates the bonding together of two semiconductor dies while the semiconductor dies are respectively disposed on semiconductor wafers, i.e., prior to cutting or otherwise separating the semiconductor dies from the wafers upon which they are formed. A wafer-wafer bonding process typically has the advantage of enabling higher interconnect density, e.g., with a connector pitch of about 5 to about 10 microns or better. Wafer-wafer bonding, however, is typically limited to bonding two semiconductor dies together, and typically requires that semiconductor dies to be bonded together via a wafer-wafer bonding process be located at the same position on each wafer, and be generally of the same size and aspect ratio.

Chip-chip bonding, within the context of the invention, incorporates the bonding together of two or more semiconductor dies and/or wafer-wafer bonded sub-assemblies after the semiconductor dies and wafer-wafer bonded sub-assemblies have been separated from the semiconductor wafers upon which they were formed. Chip-wafer bonding is similar in many respects to chip-chip bonding, except that at least one semiconductor die being bonded in a chip-wafer bonding process is still disposed on a semiconductor wafer, i.e., prior to cutting or otherwise separating the semiconductor die from the wafer upon which it was formed. Chip-chip and chip-wafer bonding both have the advantage that more than three semiconductor dies can be bonded together in the same bonding process, and typically the individual semiconductor dies can vary from one another in terms of size and/or aspect ratio. However, due to difficulties associated with precisely aligning semiconductor dies during a chip-chip or chip-wafer bonding process, typically the interconnect density is lower (e.g., about 50 microns or more) than that achievable through wafer-wafer bonding.

In addition, with respect to yields wafer-wafer bonding typically suffers from the exponential problem, wherein the yield of the wafer-wafer bonded sub-assemblies is generally equal to the product of the yields of each wafer used in the sub-assemblies. Thus, if each wafer bonded in a wafer-wafer bonding process had a 70% yield, the yield of the resulting wafer-wafer bonded sub-assemblies would only be 49%. In contrast, yields for chip-chip and chip-wafer bonding processes can be significantly higher because defective semiconductor dies can be identified and discarded prior to such processes, so that only known operational semiconductor dies are bonded together with such processes. Even with chip-wafer bonding, the semiconductor dies formed on a wafer can be tested prior to bonding, so that bonding can be omitted for those defective locations on the wafer.

By combining wafer-wafer bonding processes with chip-chip and/or chip-wafer bonding processes appropriate yields can often be obtained, thus lowering fabrication costs. For example, in some embodiments it may be desirable to utilize wafer-wafer bonding to form sub-assemblies by bonding higher performance, and thus comparatively lower yield semiconductor dies with lower performance, and thus comparatively higher yield semiconductor dies in order to minimize the adverse effects of the exponential problem with respect to such sub-assemblies.

In one embodiment, for example, a semiconductor die with a high performance compute layer may be wafer-wafer bonded with one with a layer containing memory arrays, and given the high interconnect density permitted by the wafer-wafer bonding process, a relatively high performance memory bus may be provided between the compute layer and the memory arrays. Moreover, semiconductor dies comprised largely of memory arrays tend to have yields approaching 100%, so the overall yield of such sub-assemblies would be comparable to the yield of the semiconductor dies with the compute layer. The sub-assemblies may then be tested, sorted and bonded to other sub-assemblies and/or other semiconductor chips using chip-chip or chip-wafer bonding processes that generally do not suffer as greatly from the exponential problem. For example, additional layers, e.g., an I/O layer and/or an accelerator layer, may be formed on individual semiconductor dies that are then chip-chip bonded with the sub-assemblies to form completed multi-layer semiconductor stacks, or multiple sub-assemblies may be chip-chip bonded together to support multiple processing core layers with paired high speed memory arrays.

It will be appreciated that various combinations of wafer-wafer bonded semiconductor dies, chip-chip bonded semiconductor dies and/or chip-wafer bonded semiconductor dies may be combined in a multi-layer stack consistent with the invention. In addition, semiconductor dies may be formed with one or more circuit layers, e.g., disposed on opposite faces of such dies, so that wafer-wafer bonding may be used to effectively bond together up to four circuit layers disposed on a pair of semiconductor dies. Furthermore, multiple bonding processes may be used sequentially when building a stack, including multiple chip-chip bonding steps in some embodiments.

In addition, it will be appreciated that the circuit layers in the multi-layer semiconductor stacks may include the aforementioned inter-layer bus and/or any of the thermal enhancement techniques disclosed in the aforementioned '854 application.

Figure 16:
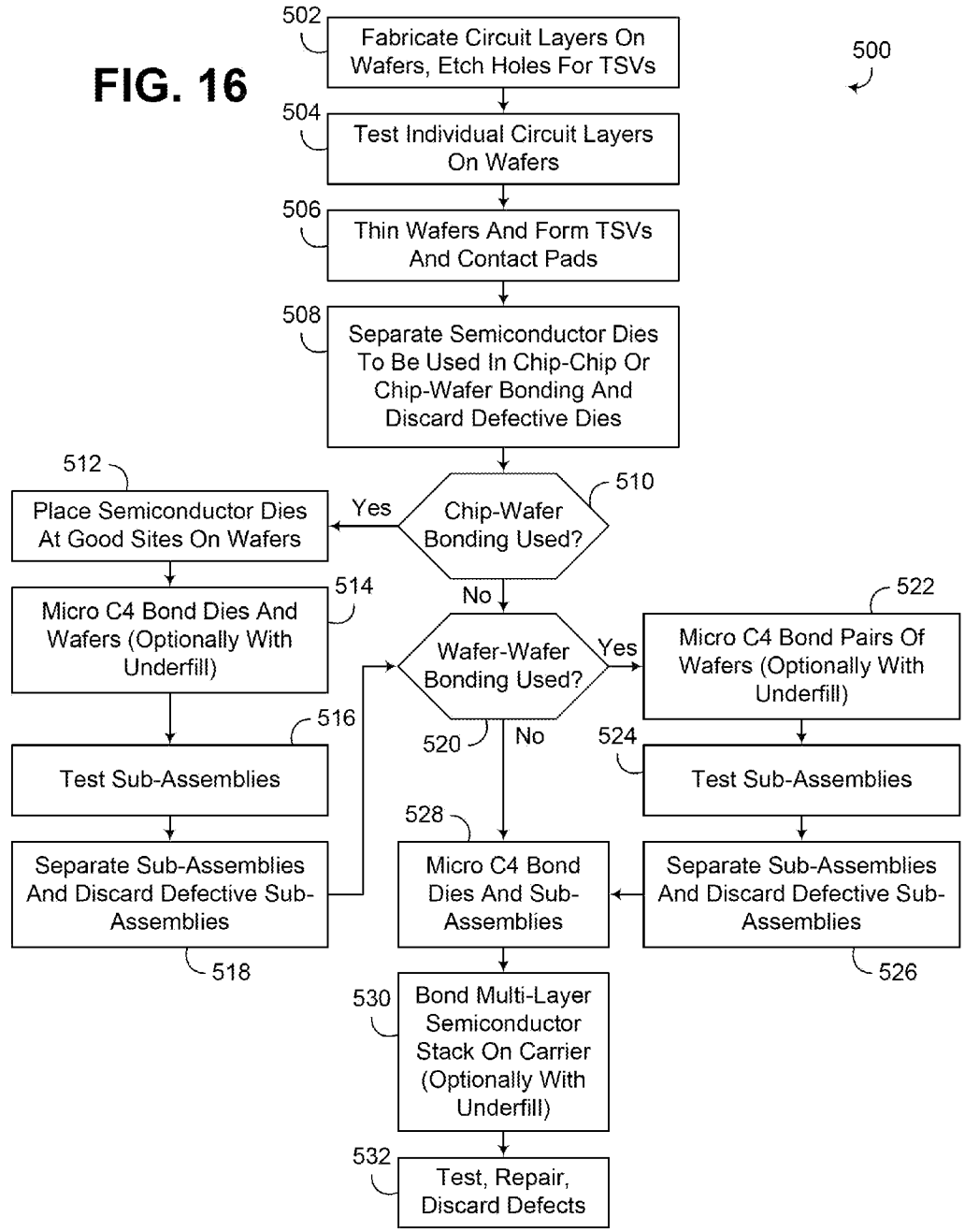
FIG. 16 is a flowchart illustrating a sequence of processing steps that may be used to fabricate a hybrid-bonded multi-layer semiconductor stack consistent with the invention.

FIG. 16 illustrates at 500 a flowchart of the sequence of processing steps that may be used to fabricate a hybrid-bonded multi-layer semiconductor stack consistent with the invention. First, the various circuit layers to be used in the multi-layer semiconductor stack are fabricated on wafers in block 502, using conventional semiconductor fabrication technology. Typically, multiple instances of such circuit layers are formed on each wafer, as is well known in the art.

In addition, during fabrication, top side contact pads are deposited, and holes partially etched into the wafers (e.g., using ion etching) from the surface of the wafer upon which the circuit layers have been formed, for use as TSVs. The holes are disposed in a regular array at the particular pitch used for the electrical/physical interconnects to be used between the semiconductor dies in the stack. For example, for semiconductor dies expected to be bonded prior to being separated from the wafer (e.g., in a wafer-wafer or chip-wafer bonding process), a pitch of between about 5 and about 10 microns may be used for the regular array of holes, while for semiconductor dies expected to be bonded after being separated from the wafer (e.g., in a chip-chip or chip-wafer bonding process), a pitch of about 50 microns may be used for the regular array of holes. The holes are etched to a depth that is less than the full thickness of the wafer (which is typically about 600 to about 800 microns thick) but is greater than the thickness of the semiconductor dies after thinning (typically about 50 to about 70 microns), so that upon thinning of the wafer, the holes will extend completely through the thickness of the thinned wafer.

Next, in block 504, the individual circuit layers are tested while on the wafers to identify any defective semiconductor dies or locations on the wafers, so that later processing steps may discard or otherwise disregard the circuit layers at these locations. Then, in block 506, the wafers are thinned to about 60 to about 70 microns in thickness, typically by supporting the wafers on glass plates on their top sides (i.e., the sides with the circuit layers formed thereon), grinding the backsides to the desired thickness and polishing to remove any bumps on the backside holes. In addition, the TSVs are formed by depositing a conductive material on the walls of the holes and filling the holes with silicon. Topographically aligned regular arrays of contact pads are then formed on the backsides of the wafers to electrically couple with topographically aligned contact pads on the top sides of the wafers. In other embodiments, testing may be performed after thinning the wafers are forming the TSVs, in addition to or in lieu of prior to thinning the wafers and forming the TSVs.

Next, in block 508, any semiconductor dies that are to be used in chip-chip or chip-wafer bonding (as the "chips" in the latter process) are separated from their wafers, and any identified defective semiconductor dies are discarded.

Then, as shown in block 510, if chip-wafer bonding is to be used in the process, the semiconductor dies separated from their respective wafers for that purpose are placed on identified good sites or locations on the wafers that are to be used in the chip-wafer bonding process (block 512). As such, any locations on the wafers that have been identified as being defective will be ignored in the placement operation.

An electrical/physical interconnect, including a plurality of electrical interconnects topographically aligned with the contact pads and the TSVs, is then formed between the wafers and the placed semiconductor dies, e.g., using a micro C4 process or another bonding processes known in the art (block 514). Optionally, an underfill material may also be utilized to eliminate air gaps and improve thermal conductivity between adjacent semiconductor dies. The resulting bonded semiconductor dies and wafers form multiple sub-assemblies, each with pairs of stacked circuit layers disposed on stacked semiconductor substrates.

Next, testing may be performed of the sub-assemblies in block 516 to identify any defective sub-assemblies. Then, in block 518, the sub-assemblies are separated from the base wafers, and any identified defective sub-assemblies are discarded.

Next in the process flow, once the sub-assemblies are formed in block 518, or if chip-wafer bonding is not used, if wafer-wafer bonding is being used (block 520), an electrical/physical interconnect, including a plurality of electrical interconnects topographically aligned with the contact pads and the TSVs, is then formed between the pairs of wafers, e.g., using a micro C4 process or another bonding processes known in the art. Typically, given the wafer-wafer bonding process used, the electrical interconnects in the electrical/physical interconnect formed in the wafer-wafer bonding process is at a smaller pitch than that used in chip-chip or chip-wafer bonding as noted above. Optionally, an underfill material may also be utilized to eliminate air gaps and improve thermal conductivity between adjacent semiconductor dies. The resulting wafer-wafer bonded wafers form multiple sub-assemblies, each with pairs of stacked circuit layers disposed on stacked semiconductor substrates.

Next, testing may be performed of the sub-assemblies in block 524 to identify any defective sub-assemblies. Then, in block 526, the sub-assemblies are separated from the base wafers, and any identified defective sub-assemblies are discarded.

Once sub-assemblies are formed by wafer-wafer bonding and/or chip-wafer bonding, a chip-chip bonding process is performed to complete the multi-layer semiconductor stack (block 528). In particular, all of the semiconductor dies and sub-assemblies to be used in each stack are aligned with one another and a micro C4 or other appropriate bonding technique is used to form electrical/physical interconnects between adjacent semiconductor dies.

Typically, each micro C4 bonding process includes deposition of solder bumps on the array of contact pads on one of the semiconductor dies to be bonded together, which are then thermally reflowed under controlled compression. As a result, some electrical/physical interconnects formed using the herein-described hybrid bonding technique may be subject to multiple reflow cycles. Thus, in some embodiments, chip-chip bonding may occur sequentially, and in multiple steps, rather than as a single step incorporating all of the circuit layers in the finished multi-layer semiconductor stack.

Once the multi-layer semiconductor stack has been bonded together, the stack is optionally bonded to a carrier, e.g., a silicon carrier, a ceramic carrier or an organic carrier, using any number of known bonding techniques, e.g., C4 or wire bonding (block 530). Thereafter, additional testing may be performed in block 532, along with any repair, rework or discarding of defective packages. Underfill may also be utilized between the stack and the carrier, and may be used before or after final testing.

It will be appreciated that process 500 as described is generic in nature, and covers a variety of different hybrid processes. In some embodiments, no chip-wafer bonding is performed, while in other embodiments, chip-wafer bonding is performed using wafers that have already been wafer-wafer bonding with another wafer. In other embodiments, chip-wafer bonding may be performed after two or more dies have been chip-chip bonded, so that a sub-assembly comprising two or more dies is chip-wafer bonded to another die disposed on a wafer. In still other embodiments, thinning of wafers may be performed after wafer-wafer bonding has been performed. Testing may also be performed at other points in the process, and the order in which testing is performed relative to separating dies from wafers or bonding dies together, may vary in other embodiments. The invention is therefore not limited to the particular ordering of steps illustrated in FIG. 16.

Figure 17:
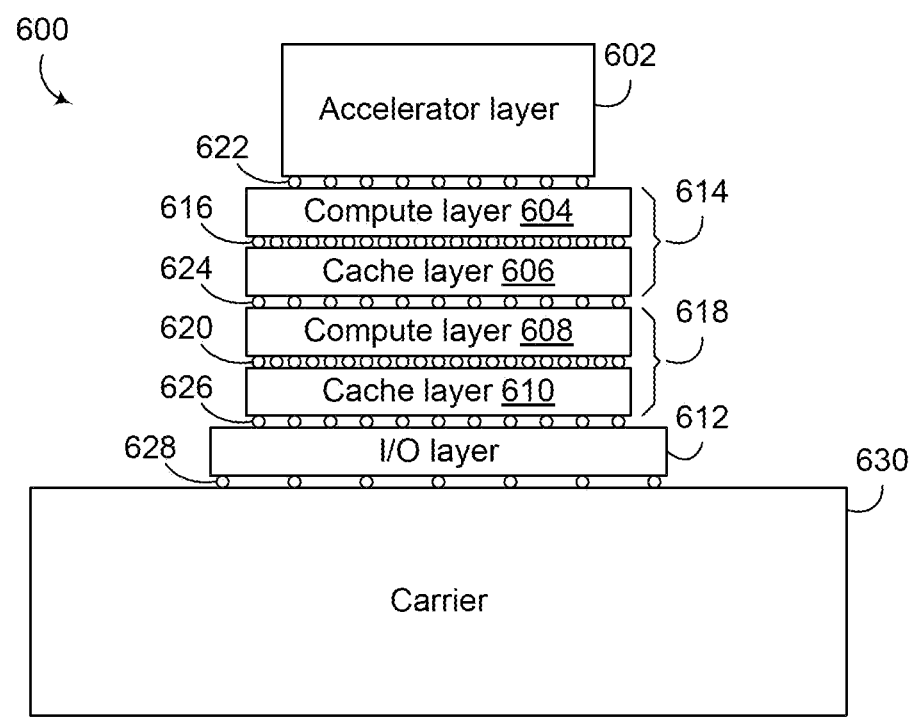
FIG. 17 is a block diagram of a hybrid-bonded multi-layer semiconductor stack consistent with the invention.

FIG. 17 next illustrates an exemplary hybrid-bonded multi-layer semiconductor stack 600 consistent with the invention, and illustrating a number of variations capable of being implemented using the aforementioned hybrid bonding process. Stack 600 includes a plurality of circuit layers disposed on a plurality of semiconductor dies 602-612, including a die 602 with an accelerator layer, a die 604 with a compute layer, a die 606 with a cache layer, a die 608 with a compute layer, a die 610 with a cache layer, and a die 612 with an I/O layer.

In this implementation, dies 604 and 606 are wafer-wafer bonded with one another to form a first sub-assembly 614 having a high density electrical/physical interconnect 616, and dies 608 and 610 are wafer-wafer bonded with one another to form a second sub-assembly 618 having a high density electrical/physical interconnect 620. Consequently, if desired a relatively high speed/bandwidth interconnect may be provided between each compute layer and its associated cache layer to maximize memory bandwidth for each compute layer. It will also be appreciated that should the same compute and cache layers be used in each of dies 604, 608 and dies 606, 610, dies 604, 608 may be formed on the same wafers, as may dies 606, 610, with the same wafer-wafer bonding step used to form sub-assemblies 614, 618.

Sub-assemblies 614, 616 are then bonded together along with dies 602 and 612 to form lower density electrical/physical interconnects 622, 624, 626 using one or both of chip-chip bonding and chip-wafer bonding. For example, in one embodiment, chip-chip bonding may be used to bond sub-assemblies 614, 616 and dies 602, 612 in a single bonding step. In another embodiment, chip-chip bonding may be used to bond together sub-assemblies 614, 616 together, as well as to one of dies 602, 612, with the remaining die 602, 612 bonded to the resulting stack via chip-wafer bonding.

FIG. 17 also illustrates stack 600 bonded via an electrical/physical interconnect 628 to a carrier 630. Also, while not expressly illustrated in FIG. 17, the circuit layer on each die 602-12 may be configured with one or more inter-layer buses configured in the manner discussed herein.

As best illustrated by die 612, it is not necessary for each die in stack 600 to have the same topographical size, or to be fabricated using the same design rules, aspect ratio or fabrication technology. In addition, as best illustrated by die 602, it is not necessary in many embodiments for all semiconductor dies in a stack to be thinned to the same thickness, and in some embodiments, a die 602 disposed at the top of a stack may not need to be thinned at all, e.g., to provide additional structural integrity for the stack, to optimize for thermal (spreading) vs. structural strength.

Therefore, it will be appreciated by one of ordinary skill in the art that the hybrid bonding technique described herein enables the capabilities of wafer-wafer bonding and chip-chip and chip-wafer bonding to be simultaneously leveraged to achieve high density interconnects while mixing and matching die sizes, aspect ratios and functions, and while controlling yield to acceptable levels.

Various modifications may be made without departing from the spirit and scope of the invention. Therefore, the invention lies in the claims hereinafter appended.

What is claimed is:

1. A circuit arrangement, comprising:
   first, second and third semiconductor dies physically and electrically coupled to one another in a stack, each semiconductor die including opposing faces, wherein at least one face of each semiconductor die includes circuit logic integrated thereon and defining a circuit layer, and each semiconductor die including an array of conductive through vias extending through such semiconductor die;
   a first electrical/physical interconnect physically and electrically coupling the first and second semiconductor dies with one another using a wafer-wafer bonding process; and
   a second electrical/physical interconnect physically and electrically coupling the second and third semiconductor dies with one another;
   wherein each semiconductor die includes an array of contact pads disposed on at least one face of such semiconductor die and topographically aligned with the array of conductive through vias, wherein the first electrical/physical interconnect includes a first array of electrical conductors extending between topographically aligned contact pads on the first and second semiconductor dies, wherein the second electrical/physical interconnect includes a second array of electrical conductors extending between topographically aligned contact pads on the second and third semiconductor dies, wherein the array of contact pads disposed on each semiconductor die is a regular array, wherein a first subset of the contact pads in the array of contact pads on each semiconductor die are configured as data-carrying contact pads that are electrically coupled to data-carrying through vias, wherein a second subset of the contact pads in the array of contact pads on each semiconductor die are configured as power-carrying contact pads that are electrically coupled to power-carrying through vias, and wherein a third subset of the contact pads are dummy contact pads that are not topographically aligned with any of the conductive through vias.

2. The circuit arrangement of claim 1, wherein a first subset of the conductive through vias in each semiconductor die are configured as data-carrying through vias that communicate data between the circuit layer on such semiconductor die and another circuit layer disposed on another semiconductor die in the stack, and wherein a second subset of the conductive through vias are configured as power-carrying through vias that are coupled to a power distribution network for the circuit layer on such semiconductor die.

3. The circuit arrangement of claim 1, wherein the circuit layer in each semiconductor die includes at least one functional unit, wherein at least one face of each semiconductor die includes an inter-layer interface region disposed thereon, wherein each inter-layer interface region on each semiconductor die is disposed at substantially the same topographic location when the respective semiconductor die is disposed within the stack, and wherein the circuit arrangement further comprises an inter-layer bus electrically coupling the functional units on the plurality of semiconductor dies to one another, the inter-layer bus comprising a plurality of electrical conductors disposed within the inter-layer interface region of each semiconductor die and extending between the opposing faces of each semiconductor die, wherein respective electrical conductors disposed in the inter-layer interface regions of adjacent semiconductor dies in the stack are electrically coupled to one another when the plurality of circuit layers are physically and electrically coupled to one another in the stack.

4. The circuit arrangement of claim 1, wherein the plurality of electrical conductors in each of the first and second electrical/physical interconnects comprise a plurality of micro C4 interconnects.

5. The circuit arrangement of claim 1, wherein the first electrical/physical interconnect has a higher interconnect density than the second electrical/physical interconnect.

6. The circuit arrangement of claim 1, wherein the first electrical/physical interconnect is formed while the first and second semiconductor dies are disposed on first and second semiconductor wafers, and wherein the first and second semiconductor dies are separated from the first and second wafers after the first electrical/physical interconnect is formed.

7. The circuit arrangement of claim 6, wherein the first and second semiconductor dies are separated from the first and second semiconductor wafers before the second electrical/physical interconnect is formed, and wherein the second electrical/physical interconnect is formed using a chip-chip bonding process.

8. The circuit arrangement of claim 6, wherein the first and second semiconductor dies are separated from the first and second semiconductor wafers after the second electrical/physical interconnect is formed, and wherein the second electrical/physical interconnect is formed using a chip-wafer bonding process.

9. The circuit arrangement of claim 6, wherein the first and second semiconductor dies each include an array of through silicon vias (TSVs) formed therein by partially etching a regular array of holes in the first and second semiconductor wafers from the first surface thereof, thinning the first and second semiconductor wafers to expose the regular array of holes on a second surface of the first and second semiconductor wafers, and forming the TSVs in the regular array of holes in the first and second semiconductor wafers.

10. The circuit arrangement of claim 1, wherein the first and third semiconductor dies differ from one another by at least one of size, thickness and aspect ratio.

11. A program product, comprising at least one hardware design file defining the plurality of circuit layers of claim 1, and a non-transitory computer readable storage medium storing the at least one hardware design file.

\* \* \* \* \*